(12) United States Patent
Yoshitake et al.

(10) Patent No.: US 6,791,117 B2
(45) Date of Patent: Sep. 14, 2004

(54) SEMICONDUCTOR LIGHT EMISSION DEVICE AND MANUFACTURING METHOD THEREOF

(75) Inventors: Shunji Yoshitake, Kawasaki (JP); Koichi Takahashi, Yokohama (JP); Shinji Nunotani, Kitakyushu (JP); Kenichi Ohashi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/341,465

(22) Filed: Jan. 14, 2003

(65) Prior Publication Data

US 2003/0132445 A1 Jul. 17, 2003

(30) Foreign Application Priority Data

Jan. 15, 2002 (JP) ........................................ 2002-006452

(51) Int. Cl.[7] .......................... H01L 33/00; H01L 21/00; H01S 5/00
(52) U.S. Cl. .............................. 257/94; 257/95; 257/96; 257/98; 257/103; 438/22; 438/24; 438/29; 438/46; 438/47; 372/45; 372/46
(58) Field of Search .............................. 257/94–96, 98, 257/103, 12–15; 372/45, 46; 438/22, 24, 29, 46, 47

(56) References Cited

U.S. PATENT DOCUMENTS 5,087,949 A 2/1992 Haitz 5,663,592 A * 9/1997 Miyazawa et al. .......... 257/627
5,814,839 A * 9/1998 Hosoba ....................... 257/96

FOREIGN PATENT DOCUMENTS

| DE | 195 37 544 | 4/1997 |
|---|---|---|
| EP | 1 271 665 | 1/2003 |
| JP | 5-167101 | 7/1993 |
| JP | 9-116190 | 5/1997 |
| WO | WO 01/18883 | 3/2001 |
| WO | WO 01/24280 | 4/2001 |
| WO | WO 01/73859 | 10/2001 |

OTHER PUBLICATIONS

R. Windisch, et al., IEEE Transactions on Electron Devices, vol. 47, No. 7, pp. 1492–1498, XP–000958488, "40% Efficient Thin–Film Surface–Textured Light–Emitting Diodes By Optimization Of Natural Lithography", Jul. 2000.

* cited by examiner

Primary Examiner—Donghee Kang
(74) Attorney, Agent, or Firm—Oblon, Spivak, McClelland, Maier & Neustadt, P.C.

(57) ABSTRACT

A semiconductor light emitting device is disclosed, which comprises a substrate, and a multi-layer semiconductor film formed on the substrate, the multi-layer semiconductor film including a plurality of semiconductor layers overlaid on the substrate, the semiconductor layers having a light emission layer for emitting a light, wherein the light is picked up at a first side of the multi-layer semiconductor film, which is a side opposite to the substrate, wherein a pattern having a light pickup surface is formed on a light emitting portion of the multi-layer semiconductor film, the light pickup surface is in a (111) plane or a plane in the vicinity of the (111) plane, and an unevenness is formed on the light pickup surface.

17 Claims, 7 Drawing Sheets

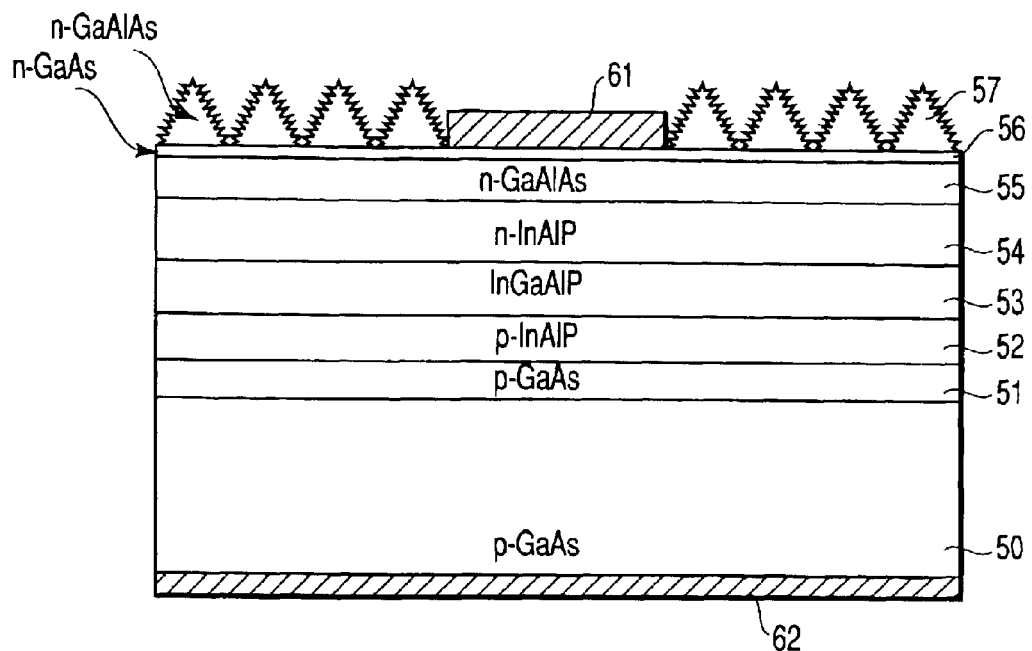
F I G. 6
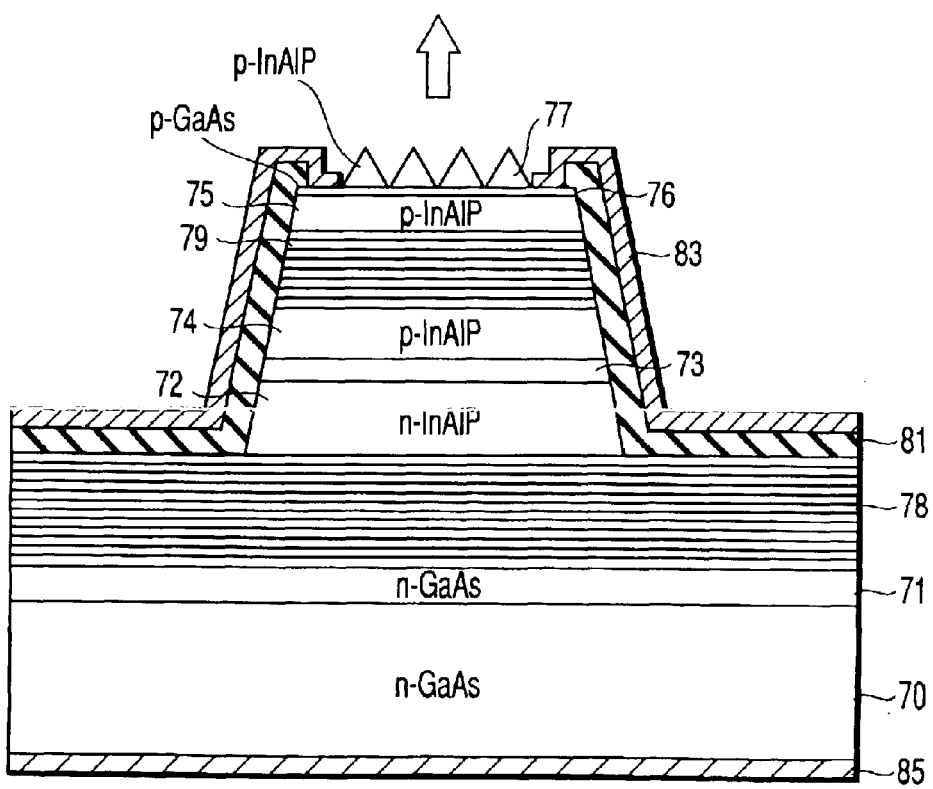
F I G. 7

SEMICONDUCTOR LIGHT EMISSION DEVICE AND MANUFACTURING METHOD THEREOF

CROSS-REFERENCE TO RELATED APPLICATIONS

This application is based upon and claims the benefit of priority from the prior Japanese Patent Application No. 2002-006452, filed Jan. 15, 2002, the entire contents of which are incorporated herein by reference.

BACKGROUND OF THE INVENTION

1. Field of the Invention

The present invention relates to a semiconductor light emitting device such as a light emitting diode (LED) and a semiconductor laser (LD) and more particularly to a semiconductor light emitting device whose light pickup surface is formed in a form of rough surface and a method of manufacturing the same.

2. Description of the Related Art

Conventionally, a light emitting portion of a high luminance light emission diode has a double-hetero structure or the like formed on a semiconductor substrate, and a current diffusion layer is formed on the light emitting portion. When the light emitting diode is packaged with resin, the upper portion of the current diffusion layer is covered with a transparent resin layer to protect the semiconductor device.

With this structure, a critical angle between the current diffusion layer (refractivity: 3.1 to 3.5) and the transparent resin layer (refractivity: about 1.5) is 25 to 29 degrees and a light having an incident angle larger than the critical angle is subject to total reflection, so that the pickup rate of light emitted from the light emitting device remarkably decreases. As a result, a pickup efficiency of the generated light remains generally about 20%.

In order to improve the light pickup efficiency, there is a technique of making the surface of the current diffusion layer rough. However, generally, the main surface of the semiconductor substrate is in a (100) plane or in a plane of (100)±several degrees off. Thus, a surface of a semiconductor layer grown on the main surface of the semiconductor substrate is also in the (100) plane or a plane of (100) ±several degrees off. It is difficult to make the plane of (100) or (100)±several degrees off rough.

Hence, conventionally, a light emitting diode packaged with a resin has such a problem that on a boundary between the uppermost layer and the transparent resin layer of a multi-layer semiconductor film containing a light emission layer, a light entered obliquely into the boundary is subject to total reflection, so that the light pickup efficiency is decreased. Further, this problem is not restricted to the light emitting diode, and is also applicable to a surface-light-emission type semiconductor laser.

BRIEF SUMMARY OF THE INVENTION

According to a first aspect of the present invention, there is provided a semiconductor light emitting device comprising a substrate; and a multi-layer semiconductor film formed on the substrate, the multi-layer semiconductor film including a plurality of semiconductor layers overlaid on the substrate, the semiconductor layers having a light emission layer for emitting a light, wherein the light is picked up at a first side of the multi-layer semiconductor film, which is a side opposite to the substrate, wherein a pattern having a light pickup surface is formed on a light emitting portion of the multi-layer semiconductor film, the light pickup surface is in a (111) plane or a plane in the vicinity of the (111) plane, and an unevenness is formed on the light pickup surface.

According to a second aspect of the present invention, there is provided a method of manufacturing a semiconductor light emitting device according to the first aspect, comprising blading a light pickup surface formed of the (100) plane to expose the (111) plane or the plane in the vicinity of the (111) plane; and carrying out a rough surface processing on the (111) plane exposed or the crystal plane exposed in the vicinity of the (111) plane to form the unevenness.

According to a third aspect of the present invention, there is provided a method of manufacturing a semiconductor light emitting device according to the first aspect, comprising forming a line-and-space mask on a light pickup surface of the (100) plane; reactive ion etching the light pickup surface into a tapered form using the mask to expose the (111) plane; and carrying out rough surface processing on the (111) plane exposed to form the unevenness.

BRIEF DESCRIPTION OF THE SEVERAL VIEWS OF THE DRAWING

FIG. 6 is a cross sectional view of a semiconductor structure of a green color light emission LED semiconductor device according to a second embodiment of the present invention;

FIG. 7 is a cross sectional view of a semiconductor structure of a surface light emission laser device according to a third embodiment of the present invention;

DETAILED DESCRIPTION OF THE INVENTION

Hereinafter, embodiments of the present invention will be described in detail with reference to the accompanying drawings.

First Embodiment

Figure 1:
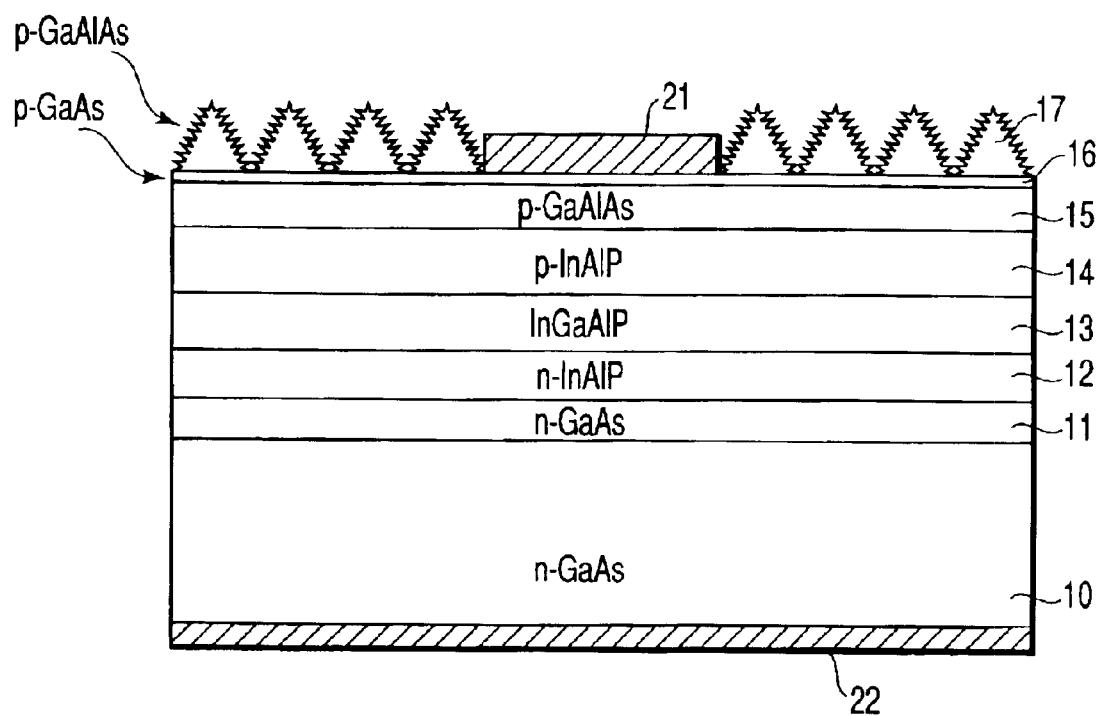
FIG. 1 is a cross sectional view of a semiconductor device of a green color light emission LED according to a first embodiment of the present invention.

FIG. 1 is a cross sectional view showing a green color light emission LED semiconductor device according to a first embodiment of the present invention.

The green color light emission LED shown in FIG. 1 comprises an n-type GaAs buffer layer 11, an n-type $In_{0.5}Al_{0.5}P$ cladding layer 12, a non-dope InGaAlP active layer 13, a p-type $In_{0.5}Al_{0.5}P$ cladding layer 14, a p-type $Ga_{0.5}Al_{0.5}As$ layer (first current diffusion layer) 15, a p-type GaAs etching stop layer 16, a p-type $Ga_{0.5}Al_{0.5}As$ layer (second current diffusion layer) 17, and an n-type GaAs cap layer (not shown). These layers are formed in the order on the upper surface of an n-type GaAs substrate 10 having a (100) plane. These laminated layers are formed by epitaxial growth. V-shaped grooves are formed in the surface of the second current diffusion layer 17 in a stripe form so that the surface is in a (111) plane.

The center portion of the second current diffusion layer 17 is removed in a circle form and a p-type layer side electrode 21 is formed in the portion. An n-type layer side electrode 22 is formed on the lower surface of the n-type GaAs substrate 10.

A method of manufacturing the LED shown in FIG. 1 will be described with reference to FIGS. 2A to 2C.

Figure 2A:
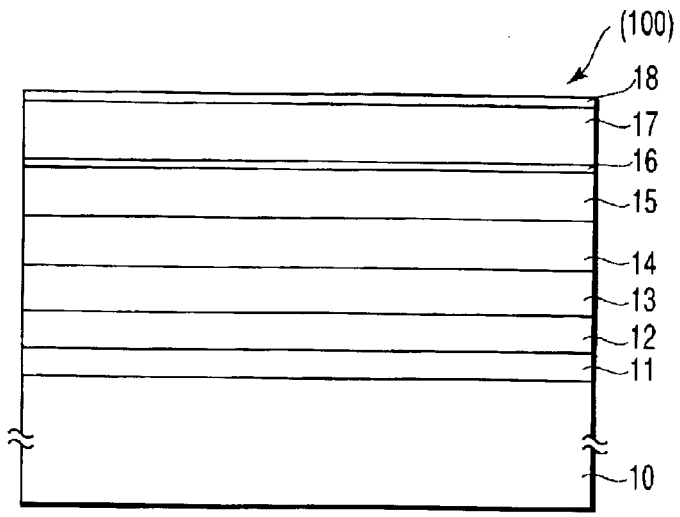
FIG. 2A is a sectional view of a semiconductor structure in a step of a method of manufacturing the green color light emission LED semiconductor device according to the first embodiment of the present invention.

As shown in FIG. 2A, an n-type GaAs substrate 10 is first prepared. The n-type GaAs substrate 10 has a (100) plane and a 250 μm thick. An n-type GaAs buffer layer 11 of 0.5 μm thick is epitaxially grown on the n-type GaAs substrate 10 by MOCVD (Metal-organic Chemical Vapor Deposition) method using $AsH_3$ as a V-family element source gas. Subsequently, an n-type $In_{0.5}Al_{0.5}P$ cladding layer 12 of 0.6 μm thick, a non-dope InGaAlP active layer 13 of 1.0 μm thick and a p-type $In_{0.5}Al_{0.5}P$ cladding layer 14 of 1.0 μm thick are epitaxially grown in the order by MOCVD method using $PH_3$ as a V-family element source gas.

After that, a p-type $Ga_{0.5}Al_{0.5}As$ layer (first current diffusion layer) 15 of 1.0 μm thick, a p-type GaAs etching stop layer 16 of 0.01 μm thick, a p-type $Ga_{0.5}Al_{0.5}As$ layer (second current diffusion layer) 17 of 5.0 μm thick and an n-type GaAs cap layer 18 of 0.1 μm thick are epitaxially grown by MOCVD method using $AsH_3$ as a V-family element source gas.

These layers from the buffer layer 11 to the cap layer 18 are formed on the same batch by epitaxial growth. Since the surface of the substrate 10 is in a (100) plane, the surface of each of the layers 11 to 18 is in a (100) surface.

Figure 2B:
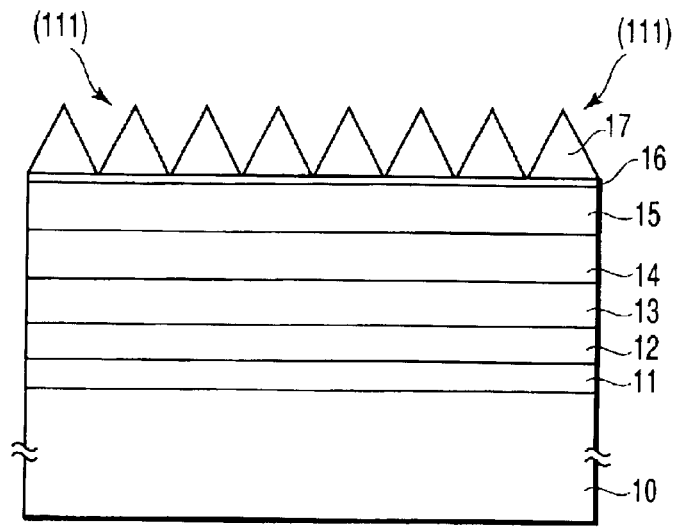
FIG. 2B is a sectional view of a semiconductor structure in a step of the method of manufacturing the green color light emission LED semiconductor device according to the first embodiment of the present invention.

Next, as shown in FIG. 2B, the lamination composed of the layers 11 to 18 is bladed 5 μm in the depth direction at an interval of 5.8 μm by using a blade apparatus having a tooth edge angle of 70 degrees such that a (111) plane is exposed on the upper surface of the lamination. Consequently, the second current diffusion layer 17 has a triangular cross section of a line-and-space pattern, so that the (111) plane of the second current diffusion layer 17 is exposed on the surface of the semiconductor device. The exposed (111) plane acts as a light pickup surface.

Figure 2C:
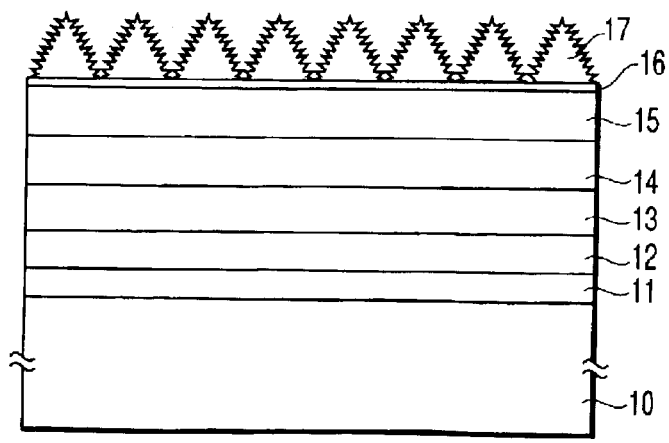
FIG. 2C is a sectional view of a semiconductor structure in a step of the method of manufacturing the green color light emission LED semiconductor device according to the first embodiment of the present invention.

Next, as shown in FIG. 2C, unevenness of sub-micron order is formed on the (111) plane of the second current diffusion layer 17 by heat-treating the semiconductor device in an HCl atmosphere at 50° C. According to an experimental example, the height and pitch of the minute unevenness were so small, i.e., the wavelength of the light emitted or less than the wavelength.

Next, portions of the cap layer 18 and the second current diffusion layer 17 at an electrode forming position are removed by etching using a resist mask. Thereafter, the p-type layer side electrode 21 (Au containing Zn) is formed by vapor deposition as an upper electrode on the electrode forming position. The GaAs substrate 10 is ground from its lower side so that it has a 100 μm thick and then, the n-type layer side electrode 22 (Au containing Ge) is formed on the lower surface of the GaAs substrate 10, so that a semiconductor device of the structure shown in FIG. 1 is obtained.

Next, a heat treatment is carried out at 450° C. in Ar atmosphere for 15 minutes. Subsequently, the substrate 10 i.e. wafer is scribed to be formed in a form of semiconductor chips. Then, a wire bonding processing is carried out and the semiconductor chips are sealed with resin.

Since, as described above, the second current diffusion layer 17 is bladed to expose the (111) plane and unevenness is provided on the (111) plane, a rough surface can be effectively achieved. In an experiment, the height and pitch of the unevenness were shorter than the wavelength of the light emitted.

Figure 3:
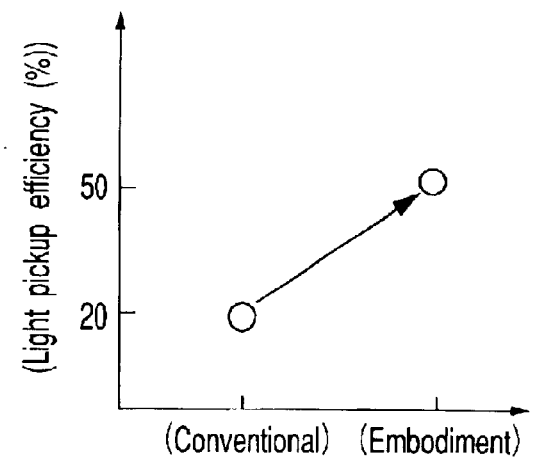
FIG. 3 is a diagram showing the light pickup efficiencies in the device of the present embodiment and a conventional device, wherein the light pickup efficiency of the device of the present embodiment is improved.

As a result, as shown in FIG. 3, the light pickup efficiency was improved by about 20% to 50% as compared to the conventional examples. A fact that the light pickup efficiency can be improved so largely without changing the basic device structure provides a large advantage for the LED.

Figure 4A:
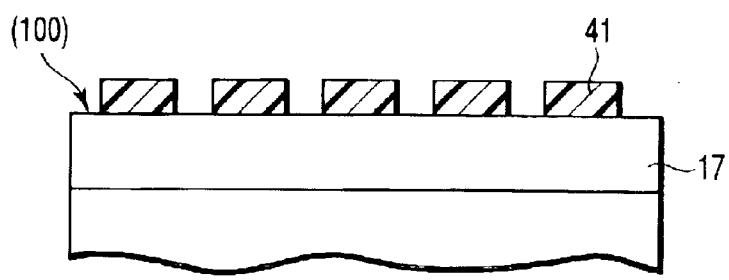
FIG. 4A is a cross sectional view of a semiconductor structure of a semiconductor device in a step of a method of forming a rough (111) plane.
Figure 4B:
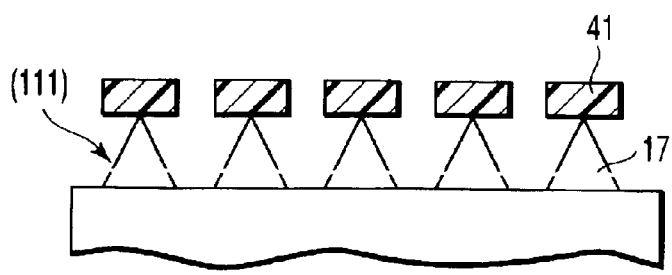
FIG. 4B is a cross sectional view of a semiconductor structure of the semiconductor device in a step of the method of forming a rough (111) plane.
Figure 4C:
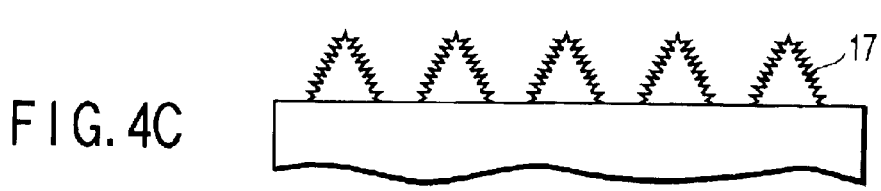
FIG. 4C is a cross sectional view of a semiconductor structure of the semiconductor device in a step of the method of forming a rough (111) plane.

The method of forming the (111) plane on the light pickup surface is not restricted to the blade processing as in the above described embodiment. An RIE method can be used. For example, as shown in FIG. 4A, a plurality of resist masks 41 are formed in a stripe form on the surface of the (100) plane of the second current diffusion layer 17. Then, a taper RIE is carried out using gas containing $Cl_2$ to form the second current diffusion layer 17 in the form of stripes. At this time, as shown in FIG. 4B, a pattern having the (111) plane is formed on the surfaces of the striped portions of the second current diffusion layer 17. After this, an HCl processing is executed to form minute unevenness on the (111) plane, as shown in FIG. 4C.

The plane which is formed on the surface is not restricted to the (111) plane. The same advantage can be obtained even if the plane is deviated from the (111) plane by some extent. According to an experiment by the inventors, the same effect was recognized even when the plane is ±20 degrees off from the (111) plane.

Figure 5A:
FIGS. 5A to 5F are cross sectional views of semiconductor structures of the semiconductor devices having unevenness formed on the (111) plane.
Figure 5B:
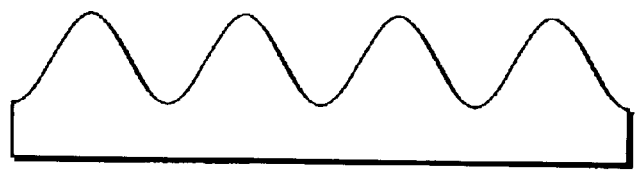
Figure 5C:
Figure 5D:
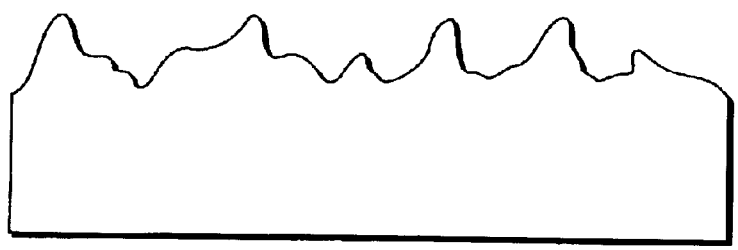
Figure 5E:
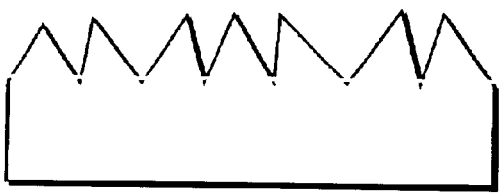
Figure 5F:

Further, the process of forming unevenness smaller than the wavelength of the light emitted is not restricted to the HCl process. A process may be employed as long as it can make the (111) plane into a rough surface. It is permissible to employ dry etching using a halogen-base gas. Wet etching can also be used. Furthermore, the shape of the unevenness may be a shape as shown in, for example, FIGS. 5A to 5F. FIG. 5A shows an example in which the RIE is carried out with EB (electron beam) mask, FIG. 5B shows an example in which wet etching is carried out with EB mask, and FIGS. 5C to 5F show examples in which wet etching is carried without a mask.

As described above, according to the embodiment, the minute unevenness can be formed on the light pickup surface by forming the (111) plane on the second current diffusion layer 17, which is a substantially uppermost layer of a multi-layer semiconductor structure and then making the light pickup surface into a rough surface by the HCl processing. Consequently, the light pickup efficiency is prevented from decreasing due to a total reflection of light on the boundary between the second current diffusion layer 17 and the sealing transparent resin layer, and thus the light pickup efficiency is improved. Further, since the (111) plane of the current diffusion layer 17 can be exposed by blade processing or the RIE method, there is no restriction applied to the plane of the surface of the current diffusion layer 17 when the current diffusion layer 17 is epitaxially grown. That is, the plane of the surface of the current diffusion layer 17 when the current diffusion layer 17 is epitaxially grown may be any plane. Therefore, this embodiment can be applied to a (100) substrate normally used, without being restricted by the plane of the substrate 10.

Second Embodiment

FIG. 6 is a cross sectional view of a semiconductor structure of a green color light emission LED semiconductor device according to a second embodiment of the present invention.

According to this embodiment, the n-type growth layer and the p-type growth layer are formed inversely to the first embodiment and its basic structure is the same as the first embodiment.

The green color light emission LED comprises a p-type GaAs buffer layer 51 of 0.5 $\mu$m thick, a p-type $In_{0.5}Al_{0.5}P$ cladding layer 52 of 0.6 $\mu$m thick, a non-dope InGaAlP active layer 53 of 1.0 $\mu$m thick, an n-type $In_{0.5}Al_{0.5}P$ cladding layer 54 of 1.0 $\mu$m thick, an n-type $Ga_{0.5}Al_{0.5}As$ layer (first current diffusion layer) 55 of 1.0 $\mu$m thick, an n-type GaAs etching stop layer 56 of 0.01 $\mu$m thick, an n-type $Ga_{0.5}Al_{0.5}As$ layer (second current diffusion layer) 57 of 5.0 $\mu$m thick, and a p-type GaAs cap layer of 0.1 $\mu$m thick (not shown). These layers are formed in the order on the upper surface of a p-type GaAs substrate 50 having a (100) plane. These laminated layers are epitaxially grown by MOCVD method. V-shaped grooves are formed in the surface of the second current diffusion layer 57 in a stripe form using a beading device or a taper RIE method so that the surface is in a (111) plane. Unevenness is provided on the (111) plane by carrying out an HCL processing.

The center portion of the second current diffusion layer 57 is removed in a circle form and an n-type layer side electrode 61 is formed in the portion. A p-type layer side electrode 62 is formed on the lower surface of the p-type GaAs substrate 50.

Also in this embodiment, a (111) plane of a second current diffusion layer 57 is exposed and unevenness is formed on the (111) plane in the same manner as in the first embodiment. Hence, the rate of a light incidence into a transparent packaging resin layer can be increased, so that the same or similar advantage as in the first embodiment is obtained.

A method of manufacturing the LED shown in FIG. 6 will be described hereinafter.

A p-type GaAs substrate 50 is first prepared. The p-type GaAs substrate 50 has a (100) plane and a 250 $\mu$m thick. A p-type GaAs buffer layer 51 of 0.5 $\mu$m thick is epitaxially grown on the p-type GaAs substrate 50 by MOCVD method using $AsH_3$ as a V-family element source gas. Subsequently, a p-type $In_{0.5}Al_{0.5}P$ cladding layer 52 of 0.6 $\mu$m thick, a non-dope InGaAlP active layer 53 of 1.0 $\mu$m thick and an n-type $In_{0.5}Al_{0.5}P$ cladding layer 54 of 1.0 $\mu$m thick are epitaxially grown in the order by MOCVD method using $PH_3$ as a V-family element source gas.

After that, an n-type $Ga_{0.5}Al_{0.5}As$ layer (first current diffusion layer) 55 of 1.0 $\mu$m thick, an n-type GaAs etching stop layer 56 of 0.01 $\mu$m thick, an n-type $Ga_{0.5}Al_{0.5}As$ layer (second current diffusion layer) 57 of 5.0 $\mu$m thick and a p-type GaAs cap layer (not shown) of 0.1 $\mu$m thick are epitaxially grown by MOCVD method using $AsH_3$ as a V-family element source gas.

These layers from the buffer layer 51 to the cap layer, not shown, are formed on the same batch by epitaxial growth. Since the surface of the substrate 50 is a (100) plane, the surface of each of the layer 51 to the cap layer, not shown, is in a (100) plane.

Next, the lamination composed of the layer 51 to the cap layer, not shown, is bladed 5 $\mu$m in the depth direction at an interval of 5.8 $\mu$m by using a blade apparatus having a tooth edge angle of 70 degrees such that a (111) plane is exposed on the upper surface of the lamination. Consequently, the second current diffusion layer 57 has a triangular cross section of a line-and-space pattern, so that the (111) plane of the second current diffusion layer 57 is exposed on the surface of the semiconductor device. The exposed (111) plane acts as a light pickup surface.

Next, unevenness of sub-micron order is formed on the (111) plane of the second current diffusion layer 57 by heat-treating the semiconductor device in an HCl atmosphere at 50° C. According to an experimental example, the height and pitch of the minute unevenness were so small, i.e., the wavelength of the light emitted or less than the wavelength.

Next, portions of the not shown cap layer and the second current diffusion layer 57 at an electrode forming position are removed by etching using a resist mask. Thereafter, the n-type layer side electrode 61 (Au containing Ge) is formed by vapor deposition as an upper electrode on the electrode forming position. The GaAs substrate 50 is ground from its lower side so that it has a 100 $\mu$m thick and then, the p-type layer side electrode 62 (Au containing Zn) is formed on the lower surface of the GaAs substrate 50, so that a semiconductor device of the structure shown in FIG. 6 is obtained.

Next, a heat treatment is carried out at 450° C. in Ar atmosphere for 15 minutes. Subsequently, the substrate 50 i.e. wafer is scribed to be formed in a form of semiconductor chips. Then, a wire bonding processing is carried out and the semiconductor chips are sealed with resin.

Third Embodiment

FIG. 7 is a cross sectional view of a semiconductor structure of a surface light emission laser device according to a third embodiment of the present invention.

An n-type GaAs substrate 70 of 250 $\mu$m thick is first prepared. An n-type GaAs buffer layer 71 of 0.5 $\mu$m thick is epitaxially grown on the upper surface of the n-type GaAs substrate 70. Subsequently, a first DBR reflection layer 78 made of a laminated structure of an n-type $In_{0.5}Al_{0.5}P$/n-type GaAs is epitaxially grown. Then, an n-type $In_{0.5}Al_{0.5}P$ cladding layer 72 of 0.6 $\mu$m thick, a MQW (Multi-quantum Well) active layer 73 of non-dope $In_{0.5}(Ga_{0.55}Al_{0.45})_{0.5}P$/$In_{0.5}Ga_{0.5}P$ and a p-type $In_{0.5}Al_{0.5}P$ cladding layer 74 of 0.6 $\mu$m thick are epitaxially grown to form a double hetero structure. Subsequently, a second DBR reflection layer 79 made of a laminated structure of a p-type $In_{0.5}Al_{0.5}P$/p-type GaAs is epitaxially grown. After that, a p-type $In_{0.5}Al_{0.5}$ p layer (first current diffusion layer) 75 of 1.0 $\mu$m thick, a p-type GaAs layer 76 of 0.01 $\mu$m thick, a p-type $In_{0.5}Al_{0.5}$ p layer (second current diffusion layer) 77 of 5.0 $\mu$m thick and an n-type GaAs cap layer (not shown) of 0.1 $\mu$m thick are epitaxially grown.

These layers from the buffer layer 71 to the not shown cap layer are formed on the same batch by epitaxial growth using MOCVD method.

The kind and pressure of the gas used are conditioned such that the respective layers are satisfactory formed.

Next, the lamination composed of the layer 71 to the not shown cap layer is bladed 5 μm in the depth direction at an interval of 5.8 μm by using a blade apparatus having a tooth edge angle of 70 degrees such that a (111) plane is exposed on the upper surface of the lamination. Consequently, the second current diffusion layer 77 has a triangular cross section of a line-and-space pattern, so that the (111) plane of the second current diffusion layer 17 is exposed on the surface of the semiconductor device. The exposed (111) plane acts as a light pickup surface.

Next, unevenness of sub-micron order is formed on the (111) plane of the second current diffusion layer 77 by heat-treating the semiconductor device in an HCl atmosphere at 50° C.

After a resist patterning, a laser ridge formation is carried out by etching from the second current diffusion layer 77 to the n-type cladding layer 72 using the resist pattern (not shown) as a mask. Then, a 0.5 μm thick insulation film ($SiO_2$) 81 is formed by deposition. Next, a resist pattern (not shown) is formed and then, a portion of the insulation film 81, a portion of the cap layer and a portion of the second current diffusion layer 77, which are in an electrode portion, are etched using the resist pattern as a mask. Subsequently, an electrode layer (Au containing Zn) is formed on the p-type layer side by vapor-deposition and then, a resist pattern (not shown) is formed. Then, by using the resist pattern as a mask, the electrode layer (Au containing Zn) is patterned so that an upper electrode 83, i.e., a p-type layer side electrode 83 is formed. Then, the substrate 70 is ground from its lower side so that it has a 100 μm thick and thereafter, an n-type layer side electrode 85 (Au containing Ge) is formed on the lower surface of the substrate 70. Next, a heat treatment is carried out at 450° C. in Ar atmosphere for 15 minutes. Subsequently, the substrate 10 or wafer is scribed so that semiconductor chips are provided. After a wire bonding, the chips are sealed with resin.

In the above-described surface light emission type laser, the (111) plane is formed on the light pickup surface, and further, the minute unevenness is formed by carrying out the HCl processing on the (111) plane. Therefore, the light pickup efficiency can be improved in the same manner as in the first and second embodiments. Although a red color light emission laser is described in this embodiment, the same or similar advantage has been recognized in other color light emission semiconductor lasers.

The method of forming the (111) plane on the light pickup surface is not restricted to the blade processing as in the above described embodiment. An RIE method can be used. For example, a plurality of resist masks are formed in a stripe form on the surface of the (100) plane of the second current diffusion layer 77. Then, a taper RIE is carried out using gas containing $Cl_2$ to form the second current diffusion layer 77 in the form of stripes, as shown in FIG. 7. At this time, a pattern having the (111) plane is formed on the surfaces of the striped portions of the second current diffusion layer 77. After this, an HCl processing is executed to form minute unevenness on the (111) plane, as shown in FIG. 7.

The plane which is formed on the surface is not restricted to the (111) plane. The same advantage can be obtained even if the plane is deviated from the (111) plane by some extent. According to an experiment by the inventors, the same effect was recognized even when the plane is ±20 degrees off from the (111) plane.

Further, the process of forming unevenness smaller than the wavelength of the light emitted is not restricted to the HCl process. A process may be employed as long as it can make the (111) plane into a rough surface. It is permissible to employ dry etching using a halogen-base gas. Wet etching can also be used. Furthermore, the shape of the unevenness may be a shape as shown in, for example, FIGS. 5A to 5F.

Fourth Embodiment

Figure 8:
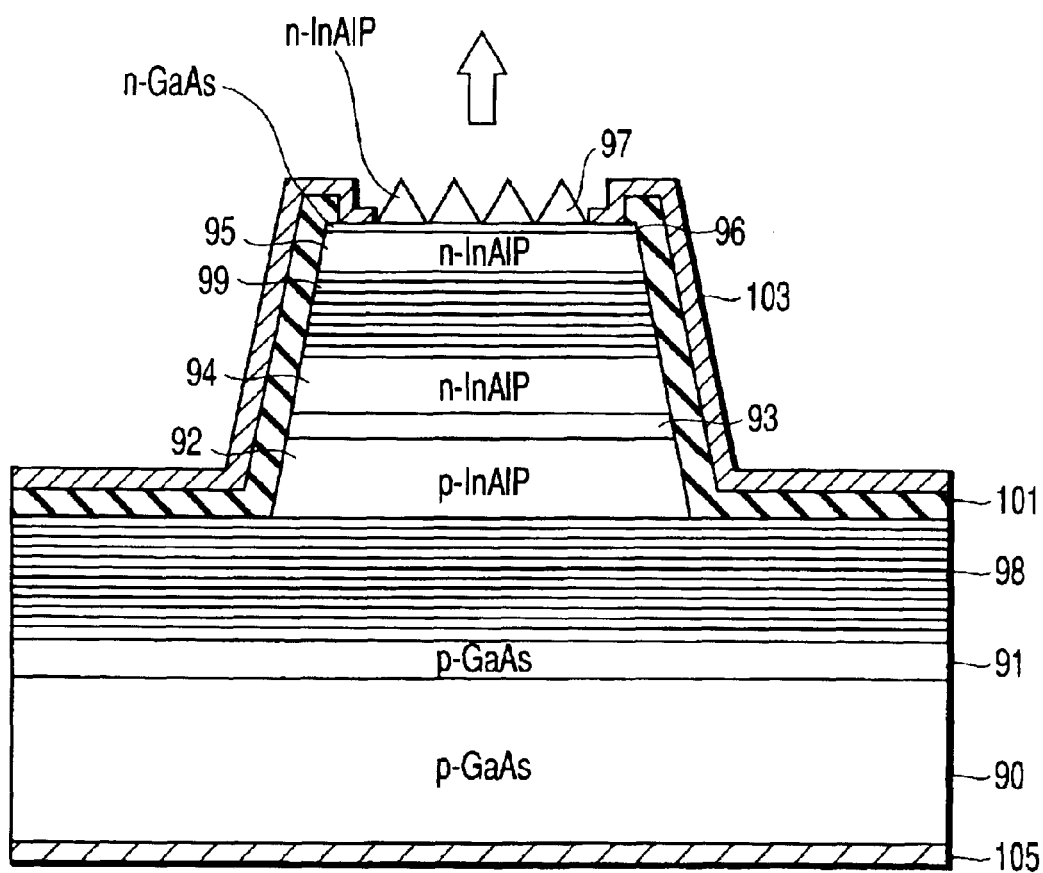
FIG. 8 is a cross sectional view of a semiconductor structure of a surface light emission laser device according to a fourth embodiment of the present invention.

FIG. 8 is a cross sectional view of a semiconductor structure of a surface light emission laser device according to a fourth embodiment of the present invention.

According to this embodiment, the n-type growth layer and the p-type growth layer are formed inversely to the first embodiment and its basic structure is the same as the third embodiment.

A p-type GaAs substrate 90 of 250 μm thick is first prepared. A p-type GaAs buffer layer 91 of 0.5 μm thick is epitaxially grown on the upper surface of the p-type GaAs substrate 90. Subsequently, a first DBR reflection layer 98 made of a laminated structure of a p-type $In_{0.5}Al_{0.5}P$/p-type GaAs is epitaxially grown. Then, a p-type $In_{0.5}Al_{0.5}P$ cladding layer 92 of 0.6 μm thick, a MQW active layer 93 of non-dope $In_{0.5}(Ga_{0.55}Al_{0.45})_{0.5}P/In_{0.5}Ga_{0.5}P$ and an n-type $In_{0.5}Al_{0.5}P$ cladding layer 94 of 0.6 μm thick are epitaxially grown to form a double hetero structure. Subsequently, a second DBR reflection layer 99 made of a laminated structure of an n-type $In_{0.5}Al_{0.5}P$/n-type GaAs is epitaxially grown. After that, an n-type $In_{0.5}Al_{0.5}$ p layer (first current diffusion layer) 95 of 1.0 μm thick, an n-type GaAs layer 96 of 0.01 μm thick, an n-type $In_{0.5}Al_{0.5}P$ layer (second current diffusion layer) 97 of 5.0 μm thick and a p-type GaAs cap layer (not shown) of 0.1 μm thick are epitaxially grown.

These layers from the buffer layer 91 to the not shown cap layer are formed on the same batch by epitaxial growth using MOCVD method.

Similarly to the third embodiment, V-shaped grooves are formed in the surface of the second current diffusion layer 97 in a stripe form using a blading device or a taper RIE method so that the surface is in a (111) plane. Unevenness is provided on the (111) plane by carrying out an HCL processing.

Further, similarly to the third embodiment, an insulation film 101 corresponding to the insulation film 81 in the third embodiment is formed, and an upper side electrode 103 and a lower side electrode 105 are formed.

Also in this embodiment, a (111) plane of a second current diffusion layer 97 is exposed and unevenness is formed on the (111) plane in the same manner as in the third embodiment. Hence, the rate of a light incidence into a transparent packaging resin layer can be increased, so that the same or similar advantage as in the third embodiment is obtained.

Modification

The present invention is not restricted to the above-described embodiments. Although a green color light emission LED has been described in the first and second embodiments, the same or similar advantage is obtained even when the present invention is applied to LED other than the green color light emission LED. As the materials of the semiconductor layers, it is possible to use an InGaAlAs series material, a GaAlAs series material, a GaP series material as well as an InGaAlP material. Furthermore, the conditions set for the semiconductor layers such as organization and thickness thereof can be changed depending on the specification of the device.

Figure 9:
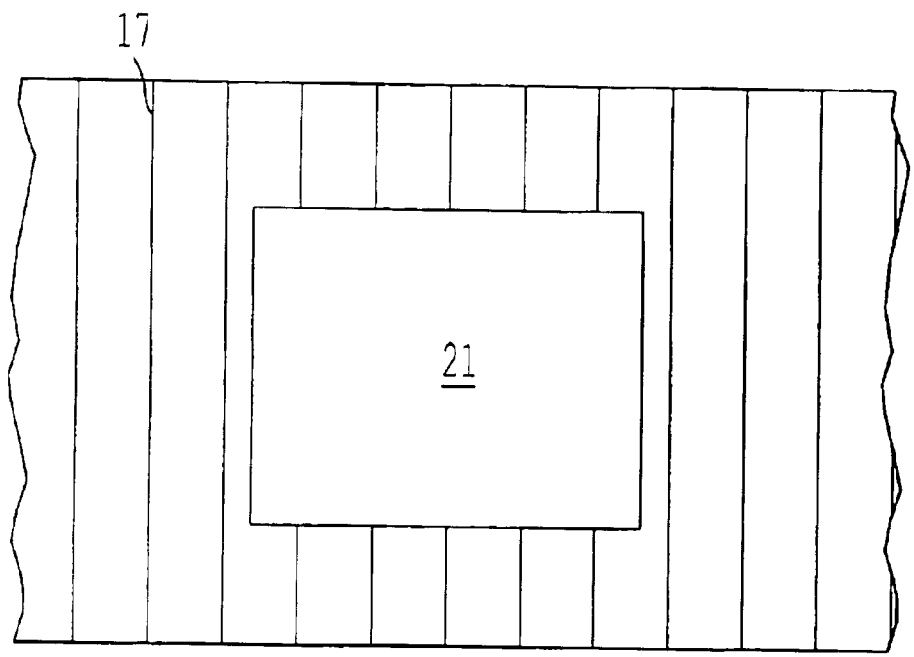
FIG. 9 is a plane view of a semiconductor structure of a semiconductor device having a plurality of patterns arranged in a form of a line.
Figure 10:
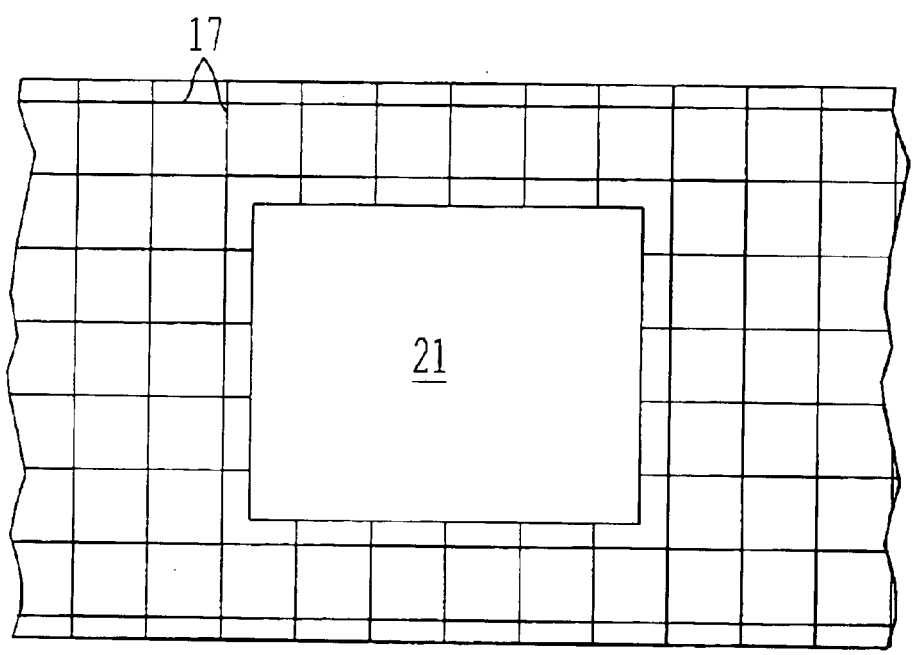
FIG. 10 is a plane view of a semiconductor structure of a semiconductor device having a plurality of patterns arranged in a form of a matrix.

The plane exposed on the light pickup surface is not restricted to the (111) plane and may be a plane slightly inclined from the (111) plane. More specifically, that plane may be within a range ±20 degree off from the (111) plane. Further, although the height and cycle of the unevenness formed on the (111) plane are desired to be equal to or smaller than the wavelength of the light emitted, the height and cycle of the unevenness are not restricted to this range. Furthermore, the pattern having the (111) plane is not always in a form of a line as shown in FIG. 9 but may be in a form of a matrix as shown in FIG. 10. When it is intended to form a matrix pattern in the case where a blade unit is used, the blade is moved on the surface in directions intersecting each other. Also, when it is intended to form a matrix pattern in the case where selective etching is used, the shape of a mask is made in the matrix form.

The present invention may be modified in various ways within a scope not departing from the gist of the invention.

As described above, according to the present invention, in a semiconductor light emitting device in which multi-layer semiconductor films containing a light emission layer are overlaid on a substrate and light is picked up at a multi-layer semiconductor film surface on an opposite side to the substrate, a pattern having the (111) plane is formed on a light pickup portion of the multi-layer semiconductor film and unevenness is formed on the (111) plane. Consequently, the light pickup efficiency can be prevented from being lowered by total reflection of light on a boundary between the uppermost layer of the multi-layer semiconductor film and a transparent resin layer, thereby leading to improvement of the light pickup efficiency.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor light emitting device comprising:
    a substrate; and
    a multi-layer semiconductor film formed on the substrate, the multi-layer semiconductor film including a plurality of semiconductor layers overlaid on the substrate, the semiconductor layers having a light emission layer for emitting a light, wherein the light is picked up at a first side of the multi-layer semiconductor film, which is a side opposite to the substrate,
    wherein a pattern having a light pickup surface is formed on a light emitting portion of the multi-layer semiconductor film, the light pickup surface is in a (111) plane or a plane in a vicinity of the (111) plane but not in a (100) plane, and an unevenness is formed on the light pickup surface.

2. The semiconductor light emitting device according to claim 1, wherein the plane of the light pickup surface is from the (111) plane to a plane inclined up to ±20 degrees from the (111) plane.

3. The semiconductor light emitting device according to claim 1, wherein the pattern formed on the light pickup portion has the light pickup surface in the (111) plane or the plane in the vicinity of the (111) plane by carrying out a predetermined processing on a (100) plane.

4. The semiconductor light emitting device according to claim 3, wherein the plane of the light pickup surface is from the (111) plane to a plane inclined up to ±20 degrees from the (111) plane.

5. The semiconductor light emitting device according to claim 1, wherein a plurality of the patterns formed on the light pickup portion are arranged in a form of a line.

6. The semiconductor light emitting device according to claim 1, wherein a plurality of the patterns formed on the light pickup portion are arranged in a form of a matrix.

7. The semiconductor light emitting device according to claim 1, wherein a height and a cycle of the unevenness formed on the light pickup surface are equal to or smaller than a wavelength of the light emitted from the multi-layer semiconductor film.

8. The semiconductor light emitting device according to claim 1, wherein the multi-layer semiconductor film has a double hetero structure portion in which an active layer is sandwiched by a pair of cladding layers and a current diffusion layer is formed on that of the cladding layers which is on the side opposite to the substrate, the light pickup surface and unevenness are formed on a surface of the current diffusion layer.

9. A method of manufacturing a semiconductor light emitting device according to claim 1, comprising:
    blading a light pickup surface formed of the (100) plane to expose the (111) plane or the plane in the vicinity of the (111) plane; and
    carrying out a rough surface processing on the (111) plane exposed or the crystal plane exposed in the vicinity of the (111) plane to form the unevenness.

10. The method of manufacturing a semiconductor light emitting device, according to claim 9, wherein the rough surface processing is carried out by dry etching the light pickup surface using a halogen-base gas.

11. The method of manufacturing a semiconductor light emitting device, according to claim 9, wherein the rough surface processing is carried out by wet etching the light pickup surface.

12. The method of manufacturing a semiconductor light emitting device, according to claim 9, wherein the rough surface processing is carried out by heat-treating the light pickup surface in an HCl atmosphere.

13. A method of manufacturing a semiconductor light emitting device according to claim 1, comprising:
    forming a line-and-space mask on a light pickup surface of the (100) plane;
    reactive ion etching the light pickup surface into a tapered form using the mask to expose the (111) plane; and
    carrying out rough surface processing on the (111) plane exposed to form the unevenness.

14. The method of manufacturing a semiconductor light emitting device, according to claim 13, wherein the rough surface processing is carried out by dry etching the light pickup surface using a halogen-base gas.

15. The method of manufacturing a semiconductor light emitting device, according to claim 13, wherein the rough surface processing is carried out by wet etching the light pickup surface.

16. The method of manufacturing a semiconductor light emitting device, according to claim 13, wherein the rough surface processing is carried out by heat-treating the light pickup surface in an HCl atmosphere.

17. The semiconductor light emitting device according to claim 1, wherein a plurality of patterns formed on the light pickup portion are arranged in a form of a line-and-space.

* * * * *